US007226352B2

(12) United States Patent
Oh

(10) Patent No.: US 7,226,352 B2
(45) Date of Patent: Jun. 5, 2007

(54) COVER STRUCTURE WITH VENT

(75) Inventor: Jong Seok Oh, Gumi-si (KR)

(73) Assignee: LG Electronics Inc., Seoul (KR)

( * ) Notice: Subject to any disclaimer, the term of this patent is extended or adjusted under 35 U.S.C. 154(b) by 184 days.

(21) Appl. No.: 11/061,480

(22) Filed: Feb. 22, 2005

(65) Prior Publication Data

US 2005/0148294 A1 Jul. 7, 2005

Related U.S. Application Data

(63) Continuation of application No. 10/653,370, filed on Sep. 3, 2003, now Pat. No. 7,014,558.

(30) Foreign Application Priority Data

Dec. 14, 2002 (KR) .............................. 2002-79922

(51) Int. Cl.
*H05K 5/00* (2006.01)

(52) U.S. Cl. ...................... 454/184; 361/695; 361/696

(58) Field of Classification Search ................ 454/184, 454/185, 195; 361/695, 696; 165/122, 80.2, 165/104.33, 104.34, 80.3; 312/236
See application file for complete search history.

(56) References Cited

U.S. PATENT DOCUMENTS 4,751,872 A * 6/1988 Lawson, Jr. ................ 454/184
5,287,244 A * 2/1994 Hileman et al. ............ 361/687
5,522,769 A 6/1996 DeGuiseppi ................ 454/270
5,707,282 A * 1/1998 Clements et al. ........... 454/184
5,886,639 A * 3/1999 Behl et al. .................. 340/635
5,927,386 A * 7/1999 Lin ........................... 165/80.3
6,172,872 B1 1/2001 Katsui ........................ 361/695
6,185,097 B1 2/2001 Behl .......................... 361/695
6,254,476 B1 * 7/2001 Choi .......................... 454/329
6,364,009 B1 4/2002 MacManus et al. ........ 165/185
6,373,697 B1 4/2002 Lajara et al. ............... 361/687
6,396,684 B2 * 5/2002 Lee ........................... 361/683
6,466,442 B2 10/2002 Lin ........................... 361/695
6,538,881 B1 3/2003 Jeakins et al. .............. 361/687
6,672,955 B2 1/2004 Charron ...................... 454/184

* cited by examiner

*Primary Examiner*—Derek S. Boles
(74) *Attorney, Agent, or Firm*—Ked & Associates, LLP

(57) ABSTRACT

A cover structure with a vent is provided which includes a cooling fan, and a cover having a vent portion provided with a plurality of air-through holes through which air forced by the cooling fan escapes. The vent portion is formed spaced away from the cooling fan by a distance of about 6–10 mm. The distance of about 6–10 mm between the cooling fan and the over reduces the fluid flow noise.

3 Claims, 9 Drawing Sheets

110
120
111
b

COVER STRUCTURE WITH VENT

This is a continuation of patent application Ser. No. 10/653,370 filed on Sept. 3, 2003, now U.S. Pat. No. 7,014,558.

BACKGROUND OF THE INVENTION

1. Field of the Invention

The present invention relates to a cover structure with a vent portion permitting the escape and intake of a fluid such as air, gas, and the like, and more particularly, to a cover structure that is used in a variety of electronic systems such as a plasma display panel (PDP) TV, a liquid crystal display (LCD) projector, and the like, the cover structure being provided with a vent portion that can minimize noise caused by fluid flow forced by a cooling fan.

2. Background of the Prior Art

Generally, electronic display systems such as a PDP TV and a LCD projector generate a large amount of heat in the course of their operations.

For example, the PDP TV generates a large amount of heat by the emission of ultraviolet rays of plasma. Such heat is generally discharged out of the system by, for example, a cooling fan. If the heat is not sufficiently discharged, the system may not be stably operated, and it may even malfunction. Particularly, as the PDP system generates relatively high heat compared to other systems, it requires a large cooling capacity compared to other systems.

In addition, in case of the LCD projector, in order to project an image formed on the LCD on a large-sized screen, a lamp of the LCD projector should be increased in its brightness.

However, when the brightness of the lamp is increased, an internal temperature of an optical engine is also increased, thereby deteriorating the functions of the projector. For example, the liquid crystal may be boiled or the polarizer may be burned.

To solve these problems, a cooling fan is installed in the system to forcedly discharge the heat out of the system.

However, the cooling fan causes noise. The noise can be classified into three types of noise: cooling fan operating noise, a vibration noise caused by a cooling fan support, and fluid flow noise caused by the flow of fluid forced by the cooling fan.

Many designs have been proposed to properly deal with the cooling fan operating noise and the vibration noise, but no design has been proposed for the fluid flow noise.

FIG. 1 shows a conventional cover structure with a cooling fan.

As shown in the drawing, a cover structure comprises a back cover 10 formed on a rear wall of a flat display, as an example, and a cooling fan 20 disposed spaced away from the back cover 10 by a predetermined distance. The back cover 10 is provided with a vent portion 11 through which air comes in or goes out.

At this point, the distance "a" between the cooling fan 20 and the back cover 10 is designed to be as small as possible so as not to deteriorate the slim characteristic of the flat display.

However, since the fluid flow noise is not considered when designing the distance "a", severe fluid flow noise is generated when the cooling fan 20 operates.

SUMMARY OF THE INVENTION

Accordingly, the present invention is directed to a cover structure with a vent that substantially obviates one or more problems due to limitations and disadvantages of the related art.

An object of the present invention is to provide a cover structure with a vent portion that is designed to minimize fluid flow noise when a cooling fan operates.

Another object of the present invention is to provide a back cover structure with a vent portion that can minimize fluid flow noise by properly designing the cooling fan and the back cover.

To achieve these objects and other advantages and in accordance with the purpose of the invention, as embodied and broadly described herein, there is provided a cover structure with a vent. The cover structure includes: a cooling fan for discharging air heated by internal parts of a system; and a cover having a vent portion provided with a plurality of air-through holes through which the air forced by the cooling fan is escaped, the vent portion formed corresponding to the cooling fan and being spaced away from a blade of the cooling fan by a distance of about 6–10 mm.

In an aspect of the present invention, there is provided a cover structure with a vent, including a cooling fan for discharging air heated by internal parts of a-system; and a cover having a vent portion provided with a plurality of air-through holes through which the air forced by the cooling fan is escaped, the vent portion formed corresponding to the cooling fan and being spaced away from the cooling fan by a distance of about 6–10 mm.

In another aspect of the present invention, there is provided a cover structure with a vent, including a cooling fan; and a cover having a vent portion provided with a plurality of air-through holes through which air forced by the cooling fan is escaped, the vent portion formed being spaced away from the cooling fan by a distance of about 6–10 mm.

Therefore, the cover structure of the present invention is designed to reduce the fluid flow noise caused by the operation of the cooling fan, thereby preventing malfunctions of the system where the cover structure is employed.

In addition, the appearance of the back cover is improved, providing a good impression to the user.

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this application, illustrate embodiment(s) of the present invention and together with the description serve to explain the principle of the present invention. In the drawings.

DETAILED DESCRIPTION OF THE PREFERRED EMBODIMENTS

Reference will now be made in detail to a preferred embodiment of the present invention with reference to the accompanying drawings.

Figure 1:
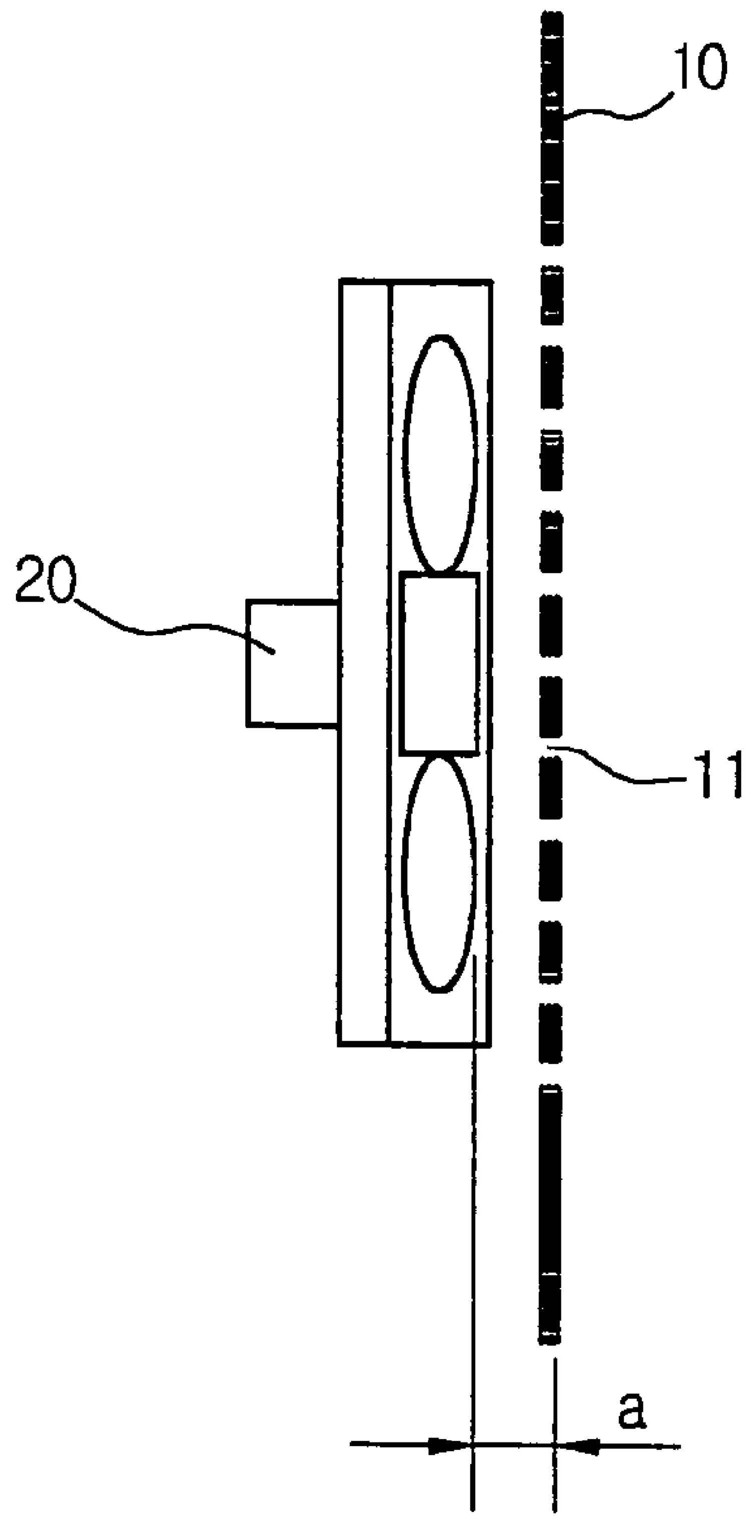
FIG. 1 is a schematic view of a conventional cover structure with a cooling fan.
Figure 2:
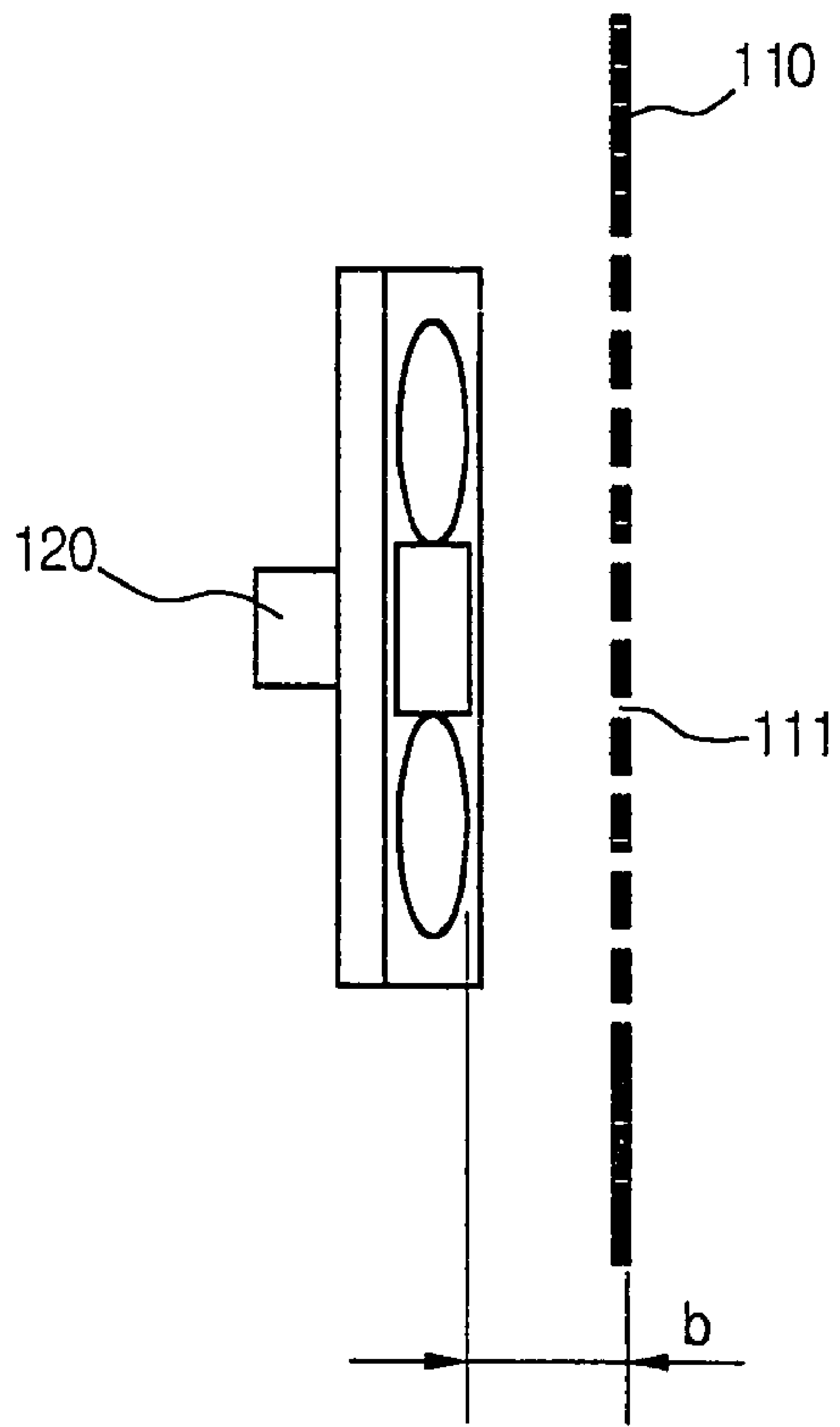
FIG. 2 is a schematic view of a back cover structure facing a cooling fan according to a first embodiment of the present invention.

FIG. 2 shows a cover structure with a vent portion according to a first embodiment of the present invention.

As shown in the drawing, a cover structure comprises a cooling fan 120 for creating a fluid (air) current, and a flat cover 110 disposed facing the cooling fan 120 with a gap “b” of about 6 mm and provided with a vent portion having a plurality of fluid-through holes 111. Although not illustrated in the drawing, the heat generating parts are located on a left side of the cooling fan 120 in the drawing.

As the cooling fan 120 and the cover 110 are provided as a back cover of a system such as a PDP TV and an LCD projector, the cover 110 will be referred to as “back cover” hereinafter. However, the present invention is not limited to this. That is, the cover 110 can be provided at a variety of locations in accordance with the applications where it is employed.

A method for determining the gap “b” between the cooling fan 120 and the back cover 110 will be described hereinafter.

A caloric value generated from the systems such as the PDP TV, the LCD projector and the like is first calculated to select the cooling fan 120 having a proper fluid flow rate.

Then, the cooling fan 120 is installed facing the back cover 110 provided with the vent portion having the fluid-through holes 111.

When the cooling fan 120 is driven, fluid in the system starts flowing. As the fluid flows, fluid flow resistance is generated, which is estimated as fluid flow noise incurred in the system. Therefore, it is possible to find a proper operating point of the cooling fan with reference to the fluid flow noise.

The estimation method of the fluid flow noise will be described hereinafter in conjunction with the accompanying drawings.

Figure 3:
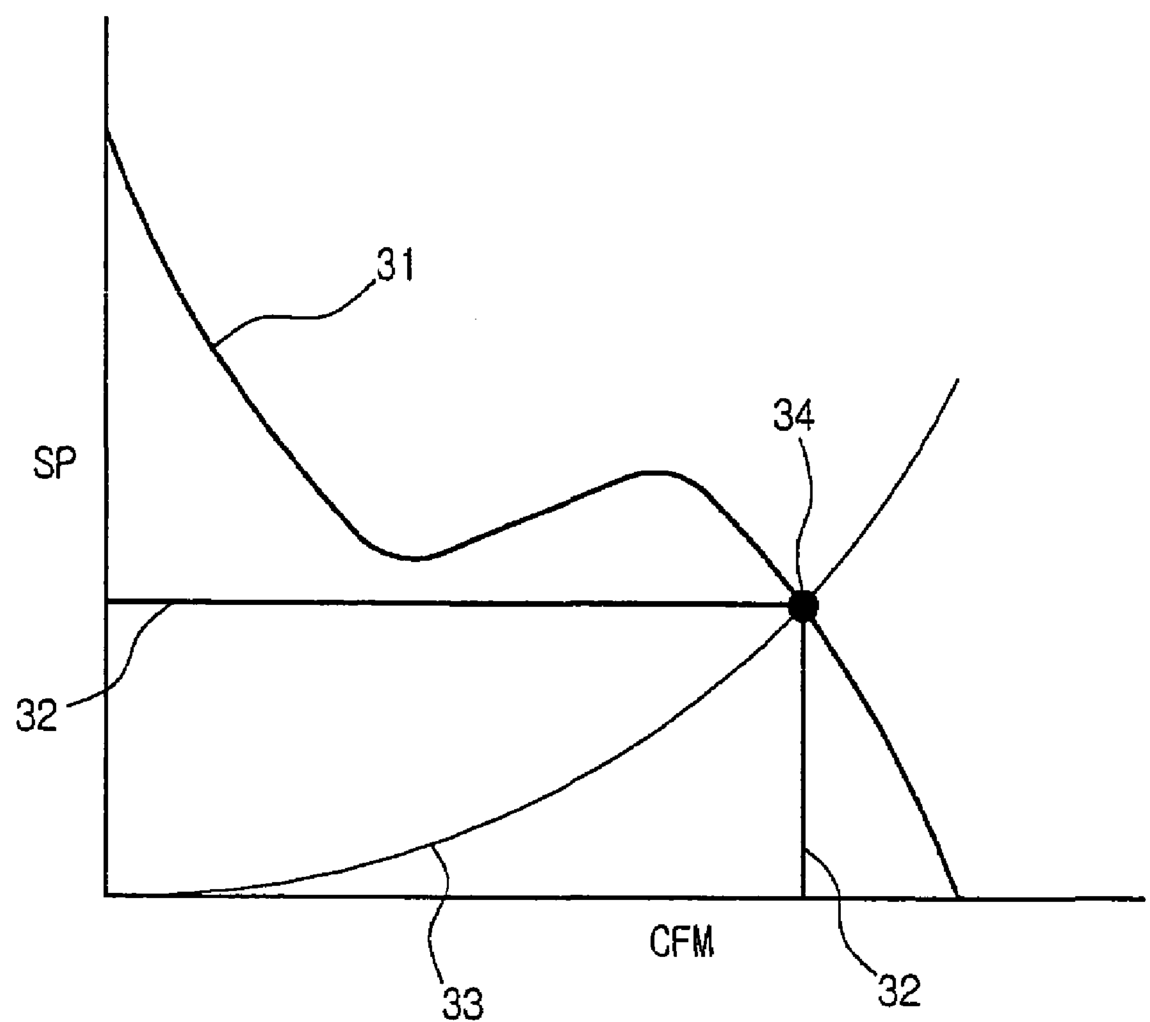
FIG. 3 is a graph illustrating a system resistance curve in accordance with the operation of a cooling fan.

FIG. 3 shows a graph illustrating the fluid flow resistance of the system where the cooling fan is employed.

In the graph of FIG. 3, the X-axis indicates cubic feet per minute (CFM), and the Y-axis denotes a static pressure rise (SP).

In addition, there are shown a fan characteristic curve 31, a performance chart 32, and a system resistance curve which passes through a performance point 34 where the fan characteristic curve 31 meets the performance chart 32.

Since a variety of fan characteristic curves 31 with respect to specific cooling fans are well known in the art, when the cooling fan is selected in accordance with the desire fluid flow rate, the fan characteristic curve 31 can be easily obtained.

In addition, by measuring an actual flow incurred by the cooling fan, the performance chart 32 and the performance point 34 can also be easily noted. Once the actual flow is determined, the static pressure rise by the actual flow can be obtained.

The system resistance curve 33 passing through the performance point 34 can be noted by assumption.

In addition, the system resistance curve 33 can be obtained by the following formula. Here, the formula is applied only when the fluid is a warm current.

$$SP=KQ^2$$

where SP is the static pressure rise, K is a constant, and Q is a volume flow rate (CFM).

In accordance with the formula, the system resistance curve 33 can be expressed as a quadratic function. When it is assumed that the system resistance curve 33 passes through the performance point 34, the curve 33 can be represented as shown in FIG. 3.

As the inclination of the system-resistance curve 33 is reduced, the performance point 34 moves along the fan characteristic curve 31 in a direction where the flow is increased and the static pressure rise is reduced. On the contrary, as the inclination of the system resistance curve 33 is increased, the performance point 34 moves along the fan characteristic curve 31 in a direction where the flow is reduced and the static pressure rise is increased. That is, the more the static pressure rise is increased, the more the fluid flow resistance is increased, thereby increasing the fluid flow noise.

Therefore, it is preferable to reduce the inclination of the system resistance curve to reduce the fluid flow noise.

On order to reduce the inclination of the system resistance curve 33, a variety of schemes for (a) properly adjusting a gap between a circuit board on which heat generating parts are mounted and the cooling fan, (b) properly varying an installation angle of the cooling fan, (c) varying the size of the fluid-through holes of the vent, and (d) properly adjusting a gap between the cooling fan and the back cover, may be proposed. The present invention relates to the scheme for properly adjusting the gap between the cooling fan and the back cover.

Figure 4:
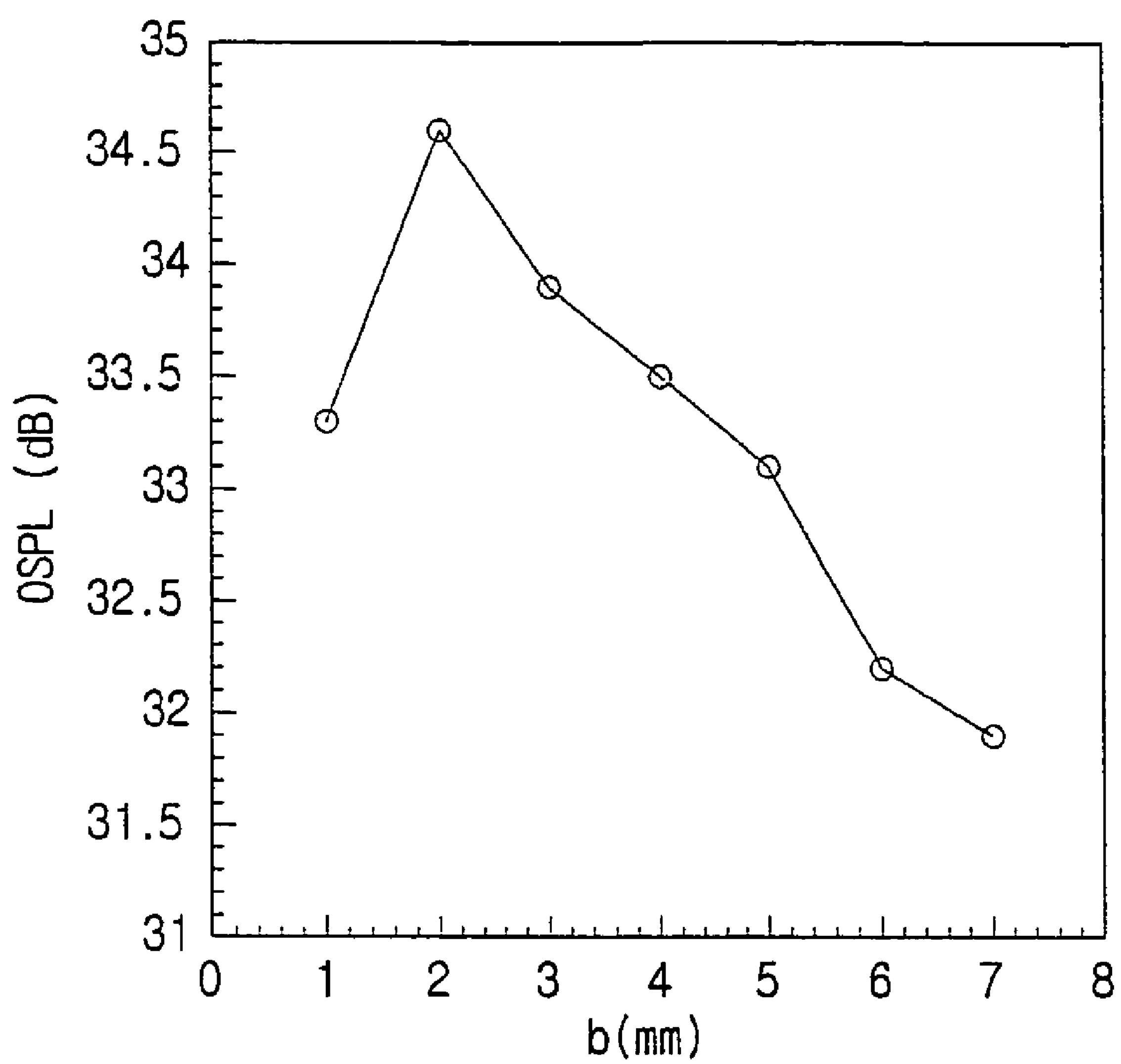
FIG. 4 is a graph illustrating fluid flow noise in accordance with the variation of a distance between a cooling fan and a back cover.

FIG. 4 shows a graph illustrating fluid flow noise in accordance with the variation of a gap between the cooling fan and the back cover.

The specification of the cooling fan used for a test is as follows:

Rated Voltage: 12V

Maximum RPM: 1,500 RPM

Maximum Noise: 25 dB.

The test is conducted by operating the cooling fan at 1,100 RPM.

In the graph, the X-axis indicates a gap “b” between the cooling fan 120 and the back cover 110, and the Y-axis denotes an overall sound pressure level (OSPL).

Describing the test results with reference to the graph, it has been noted that, when the gap “b” between the cooling fan 120 and the back cover 110 is equal to or more than 8 mm, the system resistance is reduced and the fluid flow noise is minimized.

That is, most of the fluid flow noise is eliminated when the gap “b” between the cooling fan 120 and the back cover 110 is at least 8 mm, and the OSPL is steeply reduced when the gap “b” is varied from 5 mm to 6 mm.

However, it has also been noted that, when the gap “b” is increased above 10 mm, an amount of fluid discharged through the vent portion 11 is steeply reduced, deteriorating the cooling efficiency. When considering the above results, it is preferable that the gap “b” between the cooling fan 120 and the back cover 110 is in a range of about 6–10 mm.

Figure 5:
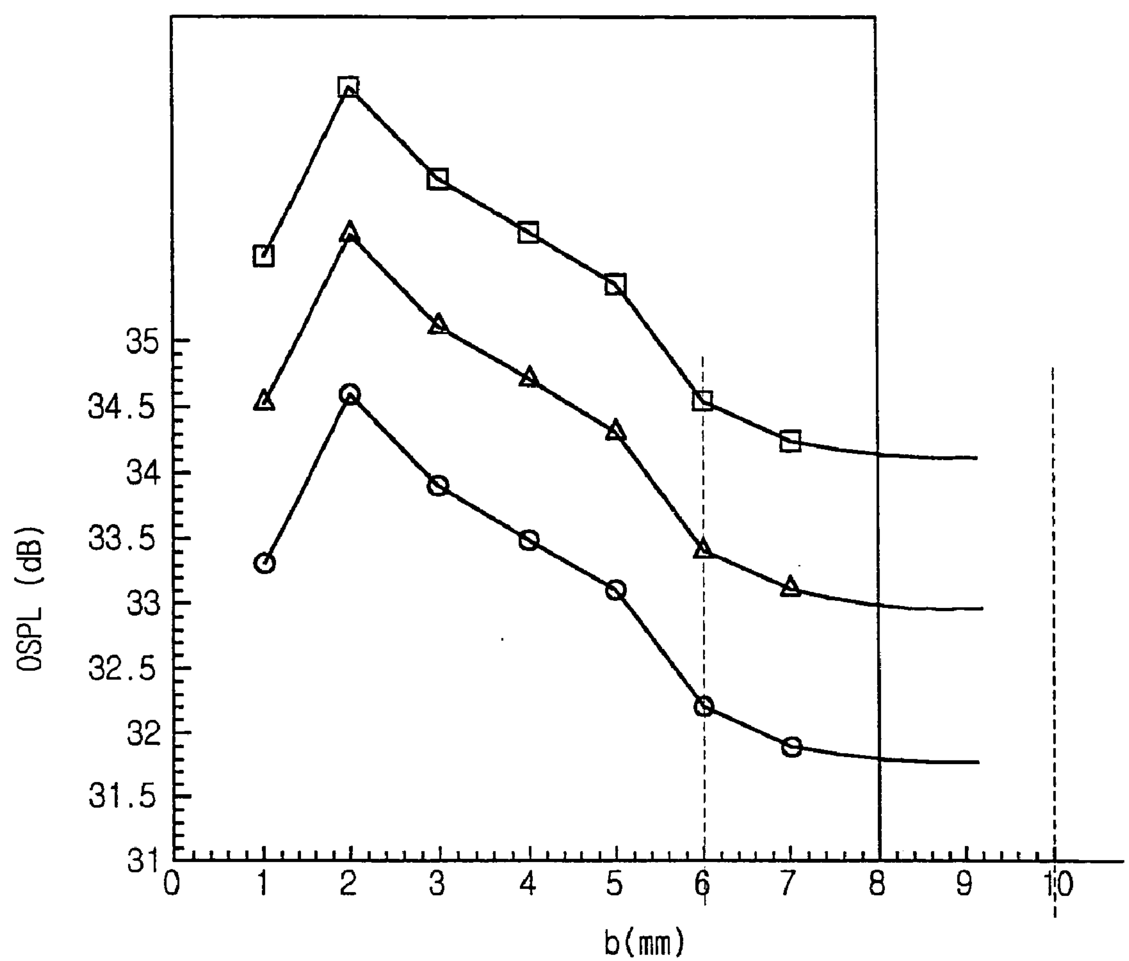
FIG. 5 is a graph illustrating fluid flow noise of a variety of fans with different specifications in accordance with the variation of a distance between a cooling fan and a back cover.

FIG. 5 shows a graph illustrating fluid flow noise of a variety of fans with different specifications from each other in accordance with the variation of a distance between a cooling fan and a back cover.

The specification of the cooling fan to be selected is varied in accordance with the calorific value of the system. FIG. 5 shows a variation of the OSPL in accordance with the variation of the gap between the cooling fan and the back cover of a variety of cooling fans having different specifications from each other.

As shown in the graph, although the fluid flow noise is varied in accordance with a capacity of the cooling fan, the fluid noise curve in accordance with the variation of the gap "b" appears in an identical pattern.

That is, even when the specifications of the cooling fans are different from each other, the fluid flow noise is optimally minimized when the gap "b" is in the range of 6–10 mm.

Figure 6:
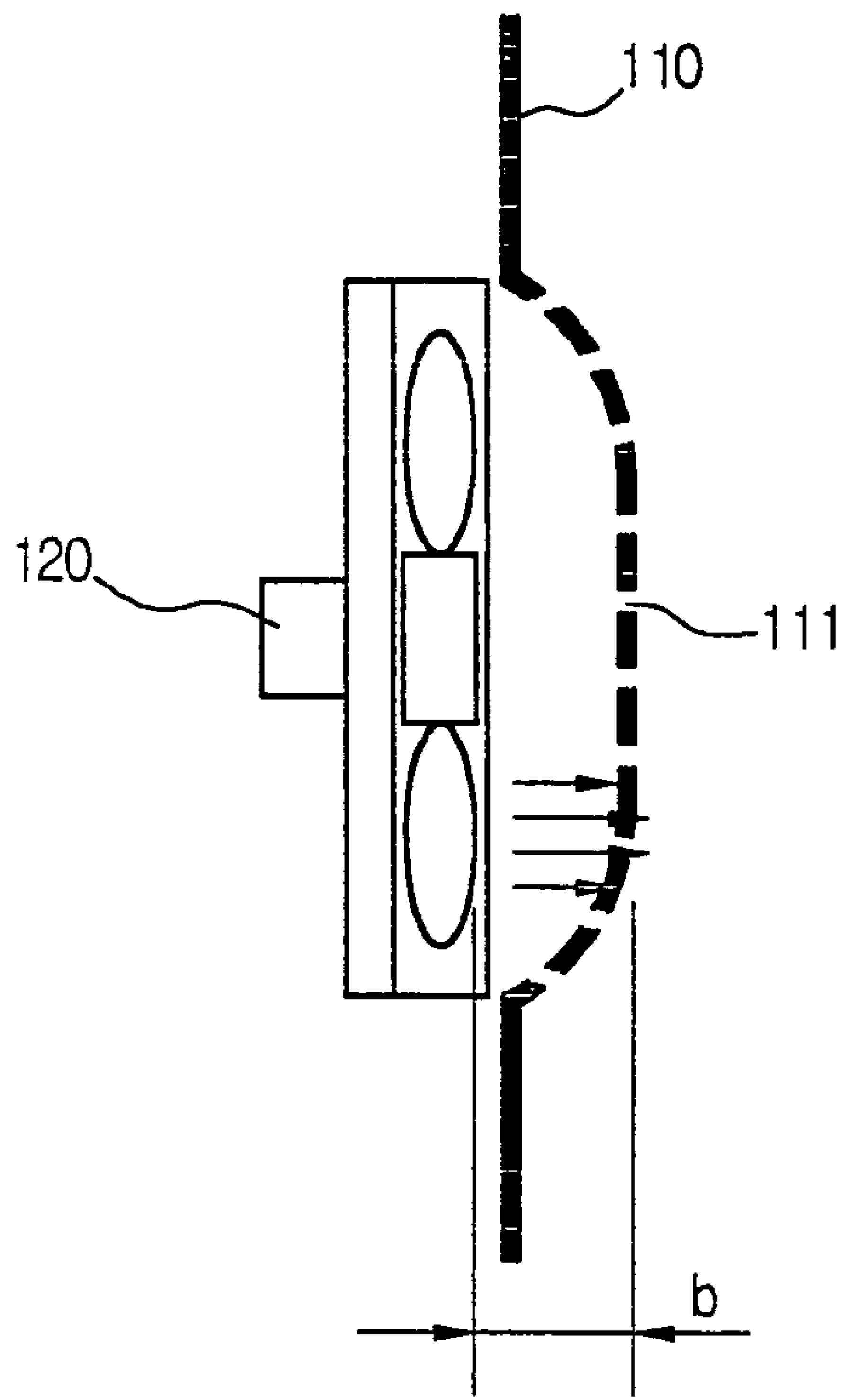
FIG. 6 is a schematic view of a back cover structure according to a second embodiment of the present invention.

FIG. 6 shows a back cover structure according to a second embodiment of the present invention.

As shown in the drawing, the back cover structure of this embodiment comprises a back cover 110 having a vent portion that is concave outward away from the cooling fan such that the vent portion can be formed in a dome shape.

Therefore, the cooling fan 120 can be disposed as close as possible to the base plane of the back cover 110, while maintaining a proper gap with the vent portion, thereby minimizing the fluid flow noise.

That is, by designing a gap between the cooling fan 120 and a specific portion (the vent) to be in a range of about 6–10 mm, more preferably 8 mm, the fluid flow noise can be minimized while not deteriorating the slim characteristic of the system.

Namely, the noise of the system can be reduced while not affecting the aesthetics.

Figure 7:
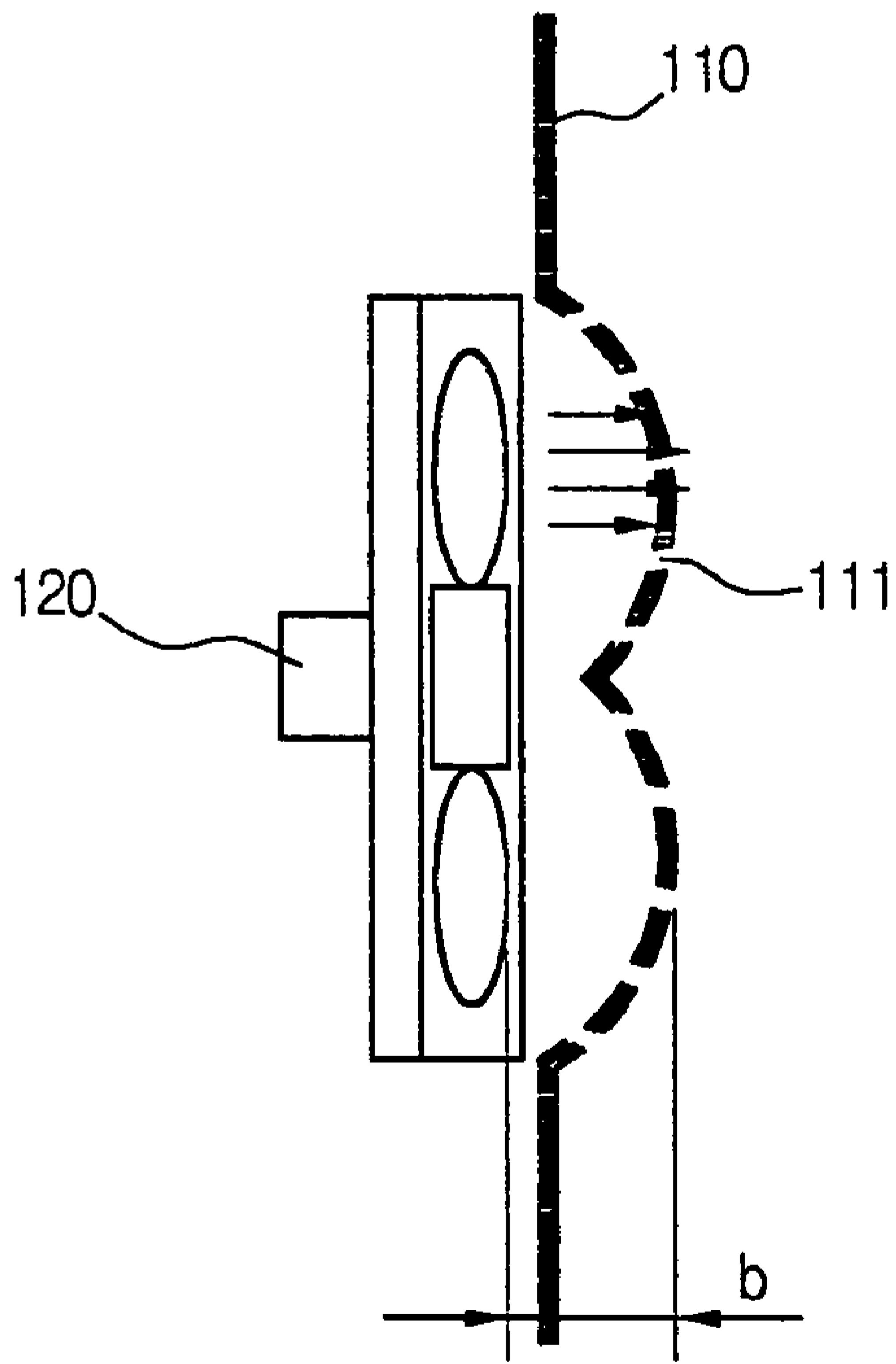
FIG. 7 is a schematic view of a back cover structure according to a third embodiment of the present invention.

FIG. 7 shows a back cover structure according to a third embodiment of the present invention.

As shown in the drawing, a vent portion of the back cover 110 is concave outward from the base plane (away from the cooling fan) such that it has a bow-shaped section.

It has been noted that the flow rate is relatively low at a center of each blade of the cooling fan, and it is relatively high at a rotational center or a periphery of the blade. Therefore, this embodiment is designed in response to such a characteristic of the flow rate. The lengths of the arrows in the drawing represent the flow rates.

Furthermore, by designing the back cover with the vent portion having the bow-shaped section, the outer appearance of the system is improved, giving a good impression to the users.

Figure 8:
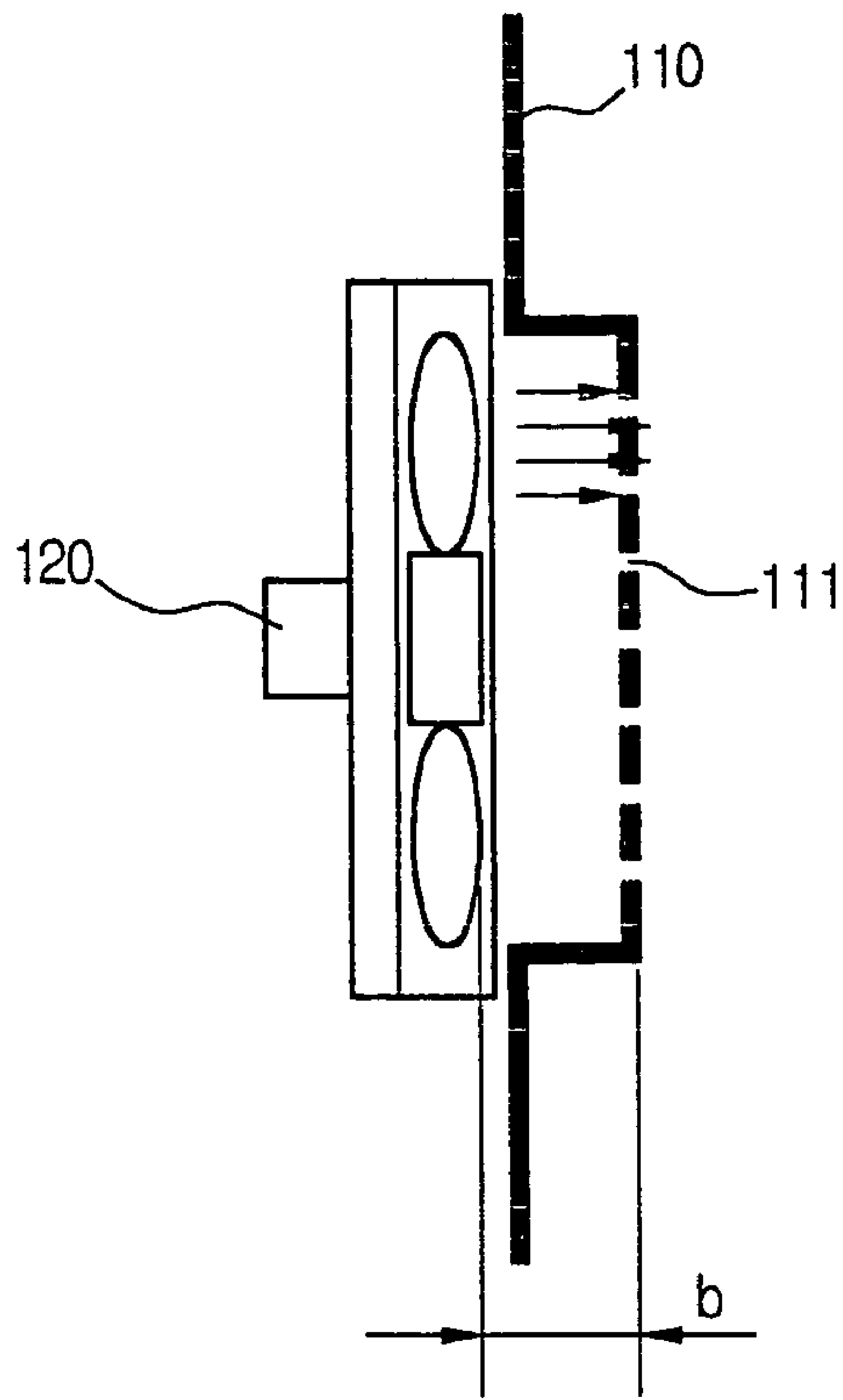
FIG. 8 is a schematic view of a back cover structure according to a fourth embodiment of the present invention.
Figure 9:
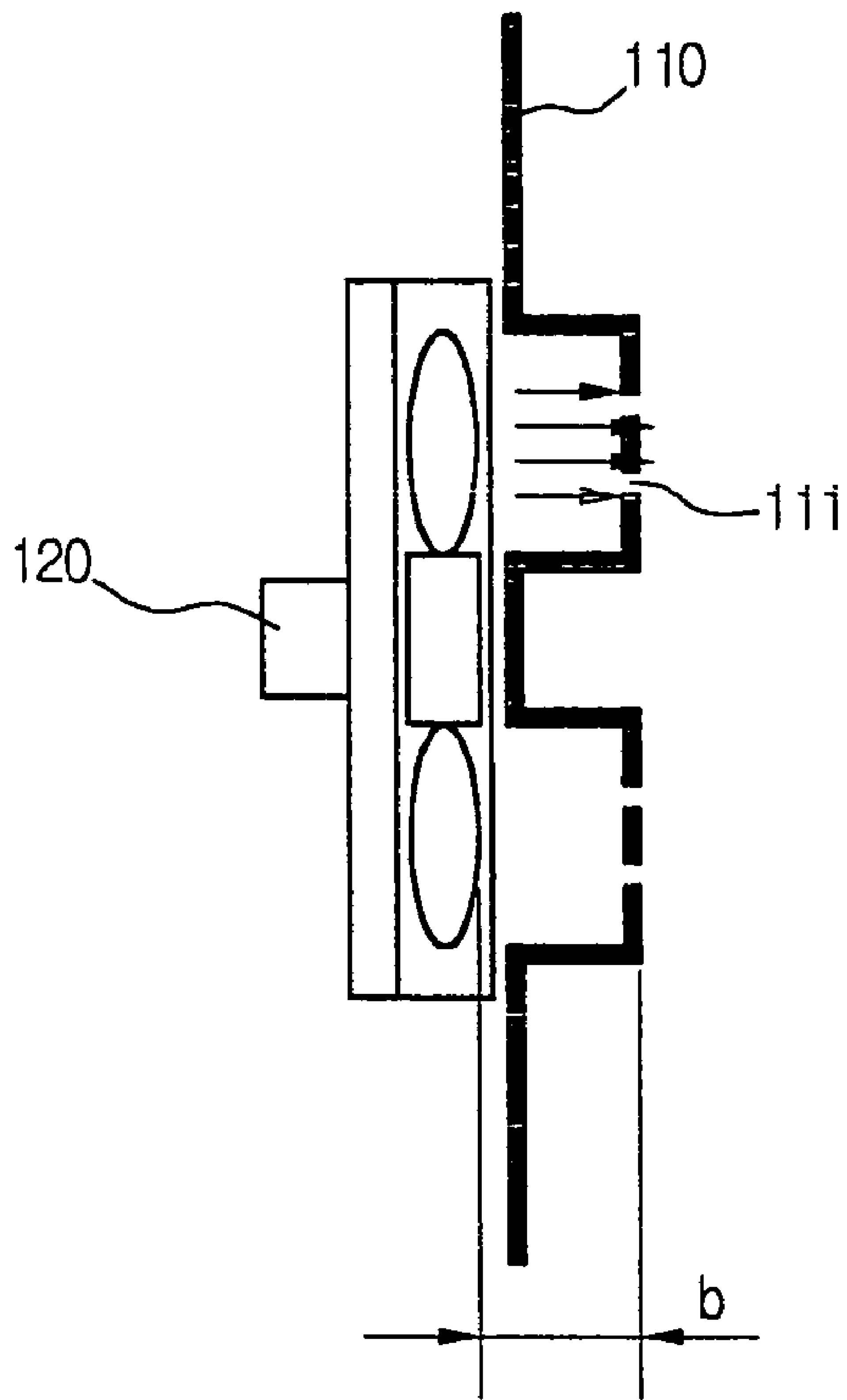
FIG. 9 is a schematic view of a back cover structure according to a fifth embodiment of the present invention.

FIGS. 8 and 9 show back cover structures according to fourth and fifth embodiment, respectively.

The vent portion 11 is concave outward from a base plane (away from the cooling fan) of the back cover 110 such that it has a square-shaped section (see FIG. 8). Alternatively, portions of the vent portion 11, which correspond to blades of the cooling fan 120 are concave outward away from the cooling fan such that they have a square-shaped section (see FIG. 9).

Meanwhile, when a gap between the cooling fan 120 and the back cover 110 is determined, the distance of the gap may be measured from each of the blades. The distance from the back cover 110 may be measured from the most concave portion of the back cover.

The vent portion corresponding to the cooling fan 110 is formed in a circular shape or a donut or rim shape, considering that the cooling fan 120 is circular shaped.

As described above, the cover structure of the present invention is designed to reduce the fluid flow noise caused by the operation of the cooling fan, thereby preventing malfunctions of the system where the cover structure is employed.

In addition, the appearance of the back cover is improved, providing a good impression to the user.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A cover structure with a vent, comprising:

a cooling fan; and a cover having a vent portion provided with a plurality of air-through holes through which air forced by the cooling fan escapes, wherein the vent portion is spaced away from the cooling fan by a distance of about 6–10 mm.

2. The cover structure according to claim 1, wherein the distance is measured from a most concave portion of the vent portion to a closest portion of the blade to the cover.

3. The cover structure according to claim 1, wherein the vent portion comprises a concave section that faces the cooling fan.

* * * * *